United States Patent [19]
Graeme

[11] Patent Number: 5,736,902
[45] Date of Patent: Apr. 7, 1998

[54] HIGH-GAIN COMMON-EMITTER OUTPUT STAGE

[75] Inventor: Jerald G. Graeme, Tucson, Ariz.

[73] Assignee: Maxim Integrated Products, Inc., Sunnyvale, Calif.

[21] Appl. No.: 684,193

[22] Filed: Jul. 19, 1996

[51] Int. Cl.[6] ........................................... H03F 3/26
[52] U.S. Cl. ............................. 330/296; 330/267
[58] Field of Search ............................. 330/263, 267, 330/268, 288, 296

[56] References Cited

U.S. PATENT DOCUMENTS

| | | | |
|---|---|---|---|
| 4,284,958 | 8/1981 | Pryor et al. | 330/253 |
| 4,313,082 | 1/1982 | Neidorff | 330/267 X |
| 4,587,495 | 5/1986 | Osawa et al. | 330/311 |
| 4,797,631 | 1/1989 | Hsu et al. | 330/253 |
| 4,814,723 | 3/1989 | Botti | 330/267 X |
| 4,935,704 | 6/1990 | Gross | 330/267 X |
| 5,019,789 | 5/1991 | Graeme et al. | 330/274 X |
| 5,384,549 | 1/1995 | Araki | 330/298 |
| 5,420,540 | 5/1995 | Butler | 330/252 |
| 5,471,172 | 11/1995 | Chiu et al. | 330/253 |

OTHER PUBLICATIONS

"Precision Rail-to-Rail Input & Output Operational Amplifier" (OP284/OP484), Analog Devices, Inc., 1995.
"Voltage Feedback Amplifier", Bipolar Circuits and Technology Meeting 9.1, p. 145, IEEE, 1993.

Primary Examiner—Steven Mottola
Attorney, Agent, or Firm—Hickman Beyer & Weaver LLP

[57] ABSTRACT

A high gain common-emitter output stage for an amplifier is disclosed. In one embodiment, an output stage for an amplifier circuit according to the invention includes: a first transistor having a base, an emitter and a collector, the emitter being connected to a first potential through a first resistor, the collector being connected to a second potential through a series connection of a second resistor and a bias current source, the base being connected between the second resistor and the bias current; a second transistor having a base, an emitter and a collector, the emitter being connected to the first potential, the collector being connected to the second potential through a load element, the base being connected to the collector of said first transistor; and a signal current source for supplying a current signal to be amplified. The output stage according to the invention is advantageous because the gain provided is exponential, yet the bias condition remains stable. The output stage also operates efficiently from a power perspective as power consumption is low during quiescent conditions.

18 Claims, 4 Drawing Sheets

HIGH-GAIN COMMON-EMITTER OUTPUT STAGE

BACKGROUND OF THE INVENTION

1. Field of the Invention

The present invention relates to output stages for analog circuits, and more particularly, to output stages for amplifiers.

2. Description of the Related Art

Amplifiers are commonly known and used in discrete analog circuits and in monolithic integrated circuits (ICs). For details on amplifier fundamentals, see e.g., Malvino, *Electronic Principles*, McGraw-Hill, Inc., 1973. Often amplifiers will consist of a number of stages. These stages may, for example, include one or more amplifying stages followed by an output stage. One function served by an output stage is to provide an appropriate output impedance. It is also desirable that the output stage also provide amplification.

FIG. 1 illustrates a schematic diagram of a conventional output stage 100 of an amplifier. The output stage 100 includes a first transistor ($Q_1$) 102 and a second transistor ($Q_2$) 104. The emitters of first and second transistors 102 and 104 are connected together and receive a supply voltage ($V_{CC}$). Hence, the output stage is referred to as having a common-emitter configuration. The bases of the first and second transistors 102 and 104 are commonly connected. The collector of the first transistor 102 is connected to a signal current source ($i_s$) 106 as well as to the commonly connected bases of the first and second transistors 102 and 104. The signal current source ($i_s$) 106 is then coupled to ground (GND). The collector of the second transistor 104 is coupled to ground (GND) via a load resistor $R_L$. The output voltage ($V_{OUT}$) is obtained from the collector of the second transistor 104.

The conventional output stage 100 is driven by the signal current source ($i_s$) 106, which serves as the input to the output stage 100. In producing the collector current ($I_C$), the output stage 100 amplifies the signal current source ($i_s$) 106 by a gain amount. The gain amount is determined by the ratio of the emitter areas, namely, the emitter area of the second transistor 104 divided by the emitter area of the first transistor 102 ($Area_{Q2}/Area_{Q1}$). The output stage produces the output voltage ($V_{OUT}$) as the product of the collector current ($I_C$) and the load resistor ($R_L$) 108. The resulting output voltage ($V_{OUT}$) is able to swing to a maximum output of within one saturation voltage ($V_{EC}$) of the supply voltage ($V_{CC}$).

One problem with the conventional output stage 100 is that the gain it provides is rather limited in practice. Specifically, the area or size for the first transistor 102 cannot be made smaller than some predetermined minimum transistor size. Further, given that speed slows as area increases, the area or size for the second transistor 104 is also restricted by speed requirements of the device. Hence, although large gains are desired, only limited gains are practical with the convention output stage 100.

Thus, there is a need for an output stage for amplifiers that yields large gains without hindering high speed operation.

SUMMARY OF THE INVENTION

Broadly speaking, the invention relates to a high gain common-emitter output stage for an amplifier. The output stage or amplifier according to the invention is advantageous because the gain provided is exponential, yet the bias condition remains stable.

In a first embodiment, an output stage for an amplifier circuit according to the invention includes: a first transistor having a base, an emitter and a collector, the emitter being connected to a first potential through a first resistor, the collector being connected to a second potential through a series connection of a second resistor and a bias current source, the base being connected between the second resistor and the bias current; a second transistor having a base, an emitter and a collector, the emitter being connected to the first potential, the collector being connected to the second potential through a load element, the base being connected to the collector of said first transistor; and a signal current source for supplying a current signal to be amplified. The output stage according to the invention is advantageous because the gain provided is exponential, yet the bias condition remains stable. The output stage also operates efficiently from a power perspective as power consumption is low during quiescent conditions.

In a second embodiment, an amplifier for amplifying a difference voltage between first and second input voltages to produce an output voltage includes: a first buffer circuit for receiving the first and second input voltages and producing complementary current signals; and a current amplification circuit for receiving the complementary current signals and outputting an output voltage, the output voltage being an amplified version of the difference of the first and second input voltages, and the current amplification circuit including complementary circuitry. The complementary circuitry includes first and second circuits connected to the first buffer circuit. The first circuit includes: a first transistor having a base, an emitter and a collector, the emitter being connected to a first potential through a first resistor, the collector being connected to a second potential through a series connection of a second resistor and a first bias current source, the base being connected between the second resistor and the first bias current source, the collector also being connected to receive a first of the complementary current signals; and a second transistor having a base, an emitter and a collector, the emitter being connected to the first potential, the collector being connected to an output terminal from which the output voltage is obtained, the base being connected to the collector of the first transistor. The second circuit includes: a third transistor having a base, an emitter and a collector, the emitter being connected to the second potential through a third resistor, the collector being connected to the first potential through a series connection of a fourth resistor and a second bias current source, the base being connected between the fourth resistor and the second bias current source, the collector also being connected to receive a second of the complementary current signal; and a fourth transistor having a base, an emitter and a collector, the emitter being connected to the second potential, the collector being connected to the output terminal, the base being connected to the collector of the third transistor. The amplifier may further include a feedback network coupled between the output terminal and the second input voltage.

Advantages of amplifiers or output stages for amplifiers according to the invention include improved gain, while maintaining a stable bias condition, full voltage swing and low power utilization. Other aspects and advantages of the invention will become apparent from the following detailed description, taken in conjunction with the accompanying drawings, illustrating by way of example the principals of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention relates to a high gain common-emitter output stage for an amplifier. The output stage according to the invention is advantageous because the gain provided is exponential, yet the bias condition remains stable.

Embodiments of the invention are discussed below with reference to FIGS. 2–5. However, those skilled in the art will readily appreciate that the detailed description given herein with respect to these figures is for explanatory purposes as the invention extends beyond these limited embodiments.

Figure 2:
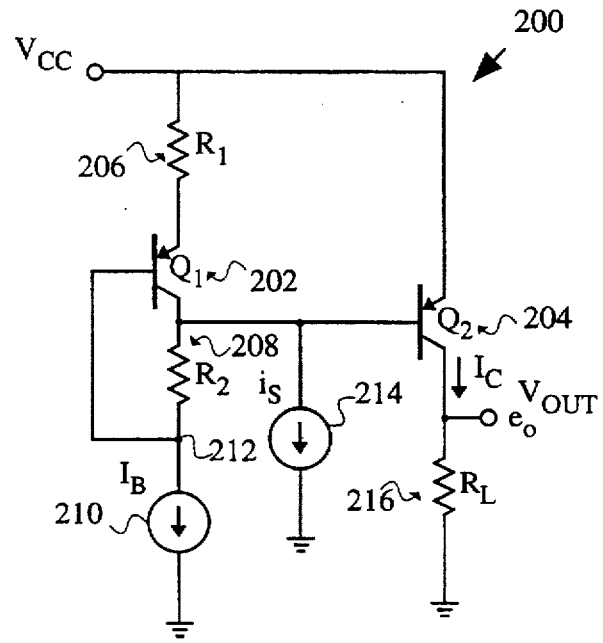
FIG. 2 illustrates a schematic diagram of an output stage of an amplifier according to a first embodiment of the invention.

FIG. 2 illustrates a schematic diagram of an output stage 200 of an amplifier according to a first embodiment of the invention. The output stage 200 includes a first transistor ($Q_1$) 202 and a second transistor ($Q_2$) 204. The emitters of first and second transistors 202 and 204 are connected together to a supply voltage ($V_{CC}$). Hence, the output stage 200 is referred to as having a common-emitter configuration. However, although the second transistor 204 connects directly to the supply voltage ($V_{CC}$), the first transistor 202 connects to the supply voltage ($V_{CC}$) via a first transistor ($R_1$) 206.

The collector of the first transistor 202 is connected to ground (GND) through the series connection of a second resistor ($R_2$) 208 and a bias current source ($I_B$) 210. More particularly, the collector of the first transistor 202 is connected to a first side of the second resistor 208 and the bias current source ($I_B$) 210 is connected between a second side of the second resistor 208 and ground (GND). The connection of the bias current source ($I_B$) 210 and the second side of the resistor 208 occurs at a node 212. The base of the first transistor 202 is also connected to the node 212. The collector of the first transistor 202 is also connected to a signal current source ($i_s$) 214. That is, the signal current source ($i_s$) 214 is connected between the collector of the first transistor 202 and ground (GND). The signal current source ($i_s$) 214 includes a DC component ($i_{s(DC)}$) and an AC component ($i_{s(AC)}$). The DC component is present even during quiescent conditions for biasing purposes. The AC component is an input current signal that is to be amplified and output.

With respect to the second transistor 204, the base of the second transistor 204 is connected to the collector of the first transistor 202 (which is in turn connected to the signal current source ($i_s$) 214), and the collector of the second transistor 204 is coupled to ground (GND) via a load resistor ($R_L$) 216. The output voltage ($V_{OUT}$) is obtained from the collector of the second transistor 204. In particular, the output voltage ($V_{OUT}$) is determined in accordance with equation 1 below.

$$V_{OUT} = i_C R_L \tag{1}$$

The resulting output voltage ($V_{OUT}$) is able to swing to a maximum output of within one saturation voltage ($V_{EC}$) of the supply voltage ($V_{CC}$).

In producing a collector current ($I_C$) from the collector of the second transistor 204, the output stage 200 amplifies the signal current source ($i_{s(AC)}$) 214 by a gain amount. The gain amount is determined by equation 2 below $$i_C = I_{s2} e^{i_{s(AC)} R_1 / V_T} \tag{2}$$

where $V_T$ is the thermal voltage and is determined by $V_T = kT/q$, with k being the Boltzmann constant, T being temperature (Kelvin), q being electronic charge magnitude, and $I_{s2}$ being the reverse saturation current of the second transistor ($Q_2$) 202.

Thus, as clear from equation (2), the output stage 200 provides a high current gain. Namely, the first resistor ($R_1$) 206 causes a high current gain in response to the signal current source ($i_s$) 214. The second resistor ($R_2$) 208, On the other hand, stabilizes the bias condition. It should be noted that the voltage across the first resistor ($R_1$) 206 increases the voltage impressed upon the emitter-base junction of the second transistor 204, while the voltage across the second resistor ($R_2$) 208 decreases it. Under quiescent conditions (i.e., $i_{s(AC)} = 0$), making the voltage drop across the first and second resistors 206 and 208 equal neutralizes the effects of the first and second resistor 206 and 208, and therefore, stabilizes the bias condition. Given that the currents running through the first and second resistors 206 and 208 are not equal, the values (e.g., ohms) of the first and second resistors 206 and 208 are typically not equal. By using monolithic IC resistors, this equal voltage condition easy to control using resistor matching. When the voltage drop across the first and second resistors 206 and 208 are essentially equal, only the emitter-base voltage of the first transistor ($Q_1$) impresses upon the emitter-base junction of the second transistor ($Q_2$) and the inherent transistor matching of monolithic processes makes the resulting bias condition highly predictable. In other words, when the voltage drop across the first and second resistors 206 and 208 are essentially equal, no significant voltage drop due to the first and second resistors 206 and 208 influences the emitter-base junction of the second transistor ($Q_2$).

Under signal drive conditions, the signal current source ($i_{s(AC)}$) 214 increases the voltage drop across the first resistor ($R_1$) 206 to produce an exponentially related current change in the second transistor 204($Q_2$). See equation 2. Note that the signal current source ($i_s$) 214 does not flow in the second resistor ($R_2$) 208 to produce a counteracting effect like that produced by the bias current source ($I_B$) 210.

Although it is preferred to have the voltage drop across the first and second resistors 206 and 208 be substantially equal, in some cases, the equal voltage condition may intentionally not be exactly met. In particular, making one of the voltages smaller or larger than the other alters the temperature coefficient of the quiescent collector current ($I_C$) conducted by the second transistor ($Q_2$) 204, as may be desired such as for a temperature dependent bias. In such cases, keeping the voltage drop difference small compared to the emitter-base voltage of the second transistor ($Q_2$) 204 retains an adequately predictable quiescent bias.

Figure 1:
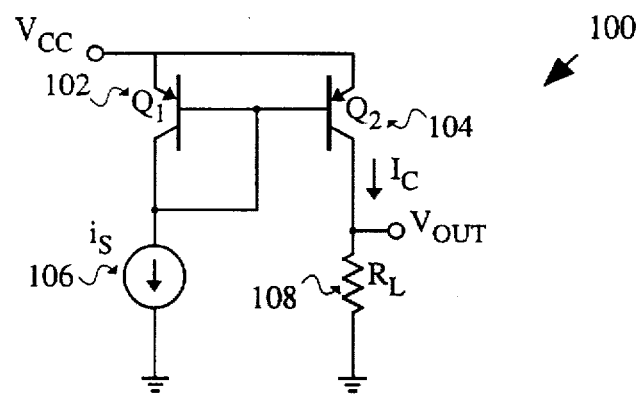
FIG. 1 illustrates a schematic diagram of a conventional output stage of an amplifier.

Another advantage of the output stage 200 according to the invention is that the fixed bias current source ($I_B$) 210 of the circuit is fixed and thus assures that the second transistor ($Q_2$) 204 never turns off under extreme signal swing conditions of the signal current source ($i_s$) 214. In other words, the bias current source ($I_B$) 210 ensures that the transistor ($Q_2$) 204 remains biased even when the signal current source ($i_s$) goes to zero. In contrast, with the conventional output stage 100 illustrated in FIG. 1, the transistor ($Q_2$) 104 turns off when the signal current source $i_s$ goes to zero. Such turn off of the transistor is undesirable because it degrades bandwidth and causes distortion.

Figure 3:
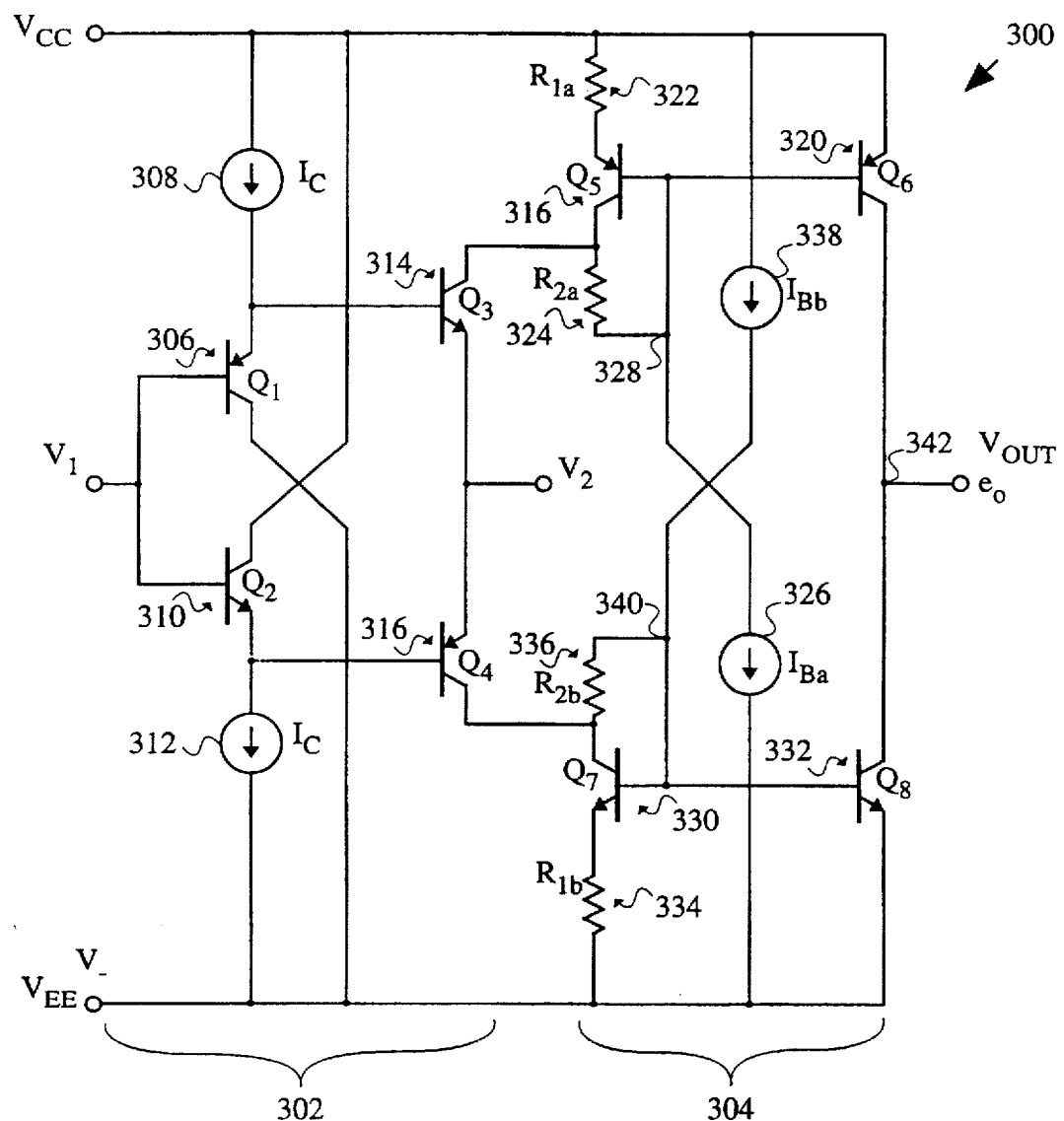
FIG. 3 is a schematic diagram of complementary output stage according a second embodiment of the invention.

FIG. 3 is a schematic diagram of complementary output stage 300 according a second embodiment of the invention. In this embodiment, a differential input voltage ($V_1-V_2$) is amplified and output. The output stage 300 includes an input diamond follower circuit 302 and a current amplifier circuit 304.

The input diamond follower 302 receives the complementary input voltages $V_1$ and $V_2$ and supplies complementary current signals to the current amplifier circuit 304. The current amplifier circuit 304 receives the complementary current signals and then amplifies the complementary current signals to output an output voltage ($V_{OUT}$).

The input diamond follower 302 includes a first transistor ($Q_1$) 306 and a second transistor ($Q_2$) 310. The base of the first transistor 306 receives the input voltage $V_1$, the collector of the first transistor 306 is connected to a current source ($I_c$) 308 that is in turn connected to a positive power supply source ($V_{CC}$), and the collector of the first transistor 306 is coupled to a negative power supply source ($V_{EE}$). The base of the second transistor 310 receives the input voltage $V_1$, the collector of the second transistor 310 is connected to the positive power supply source ($V_{CC}$), and the emitter of the second transistor 310 is connected to a current source ($I_c$) 312 that is in turn connected to the negative power supply source ($V_{EE}$). In this embodiment, the first transistor ($Q_1$) 306 is a PNP-type transistor and the second transistor ($Q_2$) 310 is an NPN-type transistor.

The input diamond follower 302 also includes a third transistor ($Q_3$) 314 and a fourth transistor ($Q_4$) 316. The input voltage $V_2$ is coupled to the commonly connected emitters of the third transistor ($Q_3$) 314 and the fourth transistor ($Q_4$) 316. The base of the third transistor 314 is connected to the emitter of the first transistor 306, and the base of the fourth transistor 316 is connected to the emitter of the second transistor 310. The input diamond follower 302 provides two (complementary) outputs to the current amplifier circuit 304. The first output is from the collector of the third transistor 314, and the second output is from the collector of the fourth transistor 316. In comparison to the first embodiment illustrated in FIG. 2, the first and second output signals from the input diamond follower 302 replaced the signal current source ($I_s$) 214.

The current amplifier circuit 304 is coupled to the input diamond follower 302 to receive the two (complementary) outputs therefrom. Since the current amplifier circuit 304 is a complementary design, the circuitry illustrated in FIG. 2 for a non-complementary design appears essentially twice in this embodiment.

One complementary portion of the current amplifier circuit 304 includes a fifth transistor ($Q_5$) 318 and a sixth transistor ($Q_6$) 320. In this embodiment, the fifth and sixth transistors 318 and 320 are PNP-type transistors. The emitter of the fifth transistor 318 is coupled to the positive power supply source ($V_{CC}$) via a first resistor ($R_{1a}$) 322. The bases of the fifth and sixth transistors 318 and 320 are connected together. The collector of the fifth transistor 318 receives the first output signal from the third transistor 314 of the input diamond follower 302. The collector of the fifth transistor 318 is also connected to a series connection of a second resistor ($R_{2a}$) 324 and a bias current source ($I_{Ba}$) 326. The bias current source ($I_{Ba}$) 326 is then in turn connected to the negative power supply source ($V_{EE}$). A connection of the second resistor ($R_{2a}$) 324 and the bias current source ($I_{Ba}$) 326 occurs at a node 328. The node 328 is also connected to the commonly connected bases of the fifth and sixth transistors 318 and 320. The emitter of the sixth transistor 320 is directly connected to the positive power supply source ($V_{CC}$), and the collector of the sixth transistor 320 is connected to an output terminal to output an output voltage $V_{OUT}$.

The other complementary portion of the current amplifier circuit 304 includes a seventh transistor ($Q_7$) 330 and an eighth transistor ($Q_8$) 332. In this embodiment, the seventh and eighth transistors 330 and 332 are NPN-type transistors. The emitter of the seventh transistor 330 is coupled to the negative power supply source ($V_{EE}$) via a first resistor ($R_{1b}$) 334. The bases of the seventh and eighth transistors 330 and 332 are connected together. The collector of the seventh transistor 330 receives the second output signal from the fourth transistor 316 of the input diamond follower 302. The collector of the seventh transistor 330 is also connected to a series connection of a resistor ($R_{2b}$) 336 and a bias current source ($I_{Bb}$) 338. The bias current source ($I_{Bb}$) 338 is then in turn connected to the positive power supply source ($V_{CC}$). A connection of the second resistor $R_{2b}$ 336 and the bias current source ($I_{Bb}$) 338 occurs at a node 340. The node 340 is also connected to the bases of the seventh and eighth transistors 330 and 332. The emitter of the eighth transistor 332 is directly connected to the negative power supply source ($V_{EE}$), and the collector of the eighth transistor 332 is connected to the output terminal to output the output voltage $V_{OUT}$.

The output impedance of the output stages 200, 300 are another limitation associated with the common-emitter output stages. With the first and second embodiments described above, the high impedance of transistor collectors at the output terminal makes the output stages highly sensitive to loading effects. Hence, output stages according to the invention may further include a feedback network to reduce the output impedance at the transistor collectors. By applying feedback from the output terminal, the output stage is desensitized to the loading effects.

One example of a feedback network is a direct connection from the output terminal to the input terminal receiving the input voltage $V_2$. Such a direct connection provides unity feedback to make $V_{OUT}$ follow $V_1$. Any output loading error would then produce a difference between the input voltages $V_1$ and $V_2$, causing corrective drive of the current amplifier circuit 304 to remove the loading error.

In practice, however, the feedback network requires a feedback factor less than unity to fully realize the output swing capability (i.e., dynamic range) of the output stage. In general, the transistors 320 and 322 ($Q_6$ and $Q_8$) can swing to within their saturation voltages of their respective power supplies. However, with the direct connection type of the feedback network, the voltage swing (or dynamic range) is limited by the input diamond follower 302 (which does not offer as great a voltage swing). Hence, by setting a closed-loop gain greater than unity (i.e., feedback factor less than one) allows the output to swing a larger voltage than that applied at the input to the input diamond follower 302.

Figure 4:
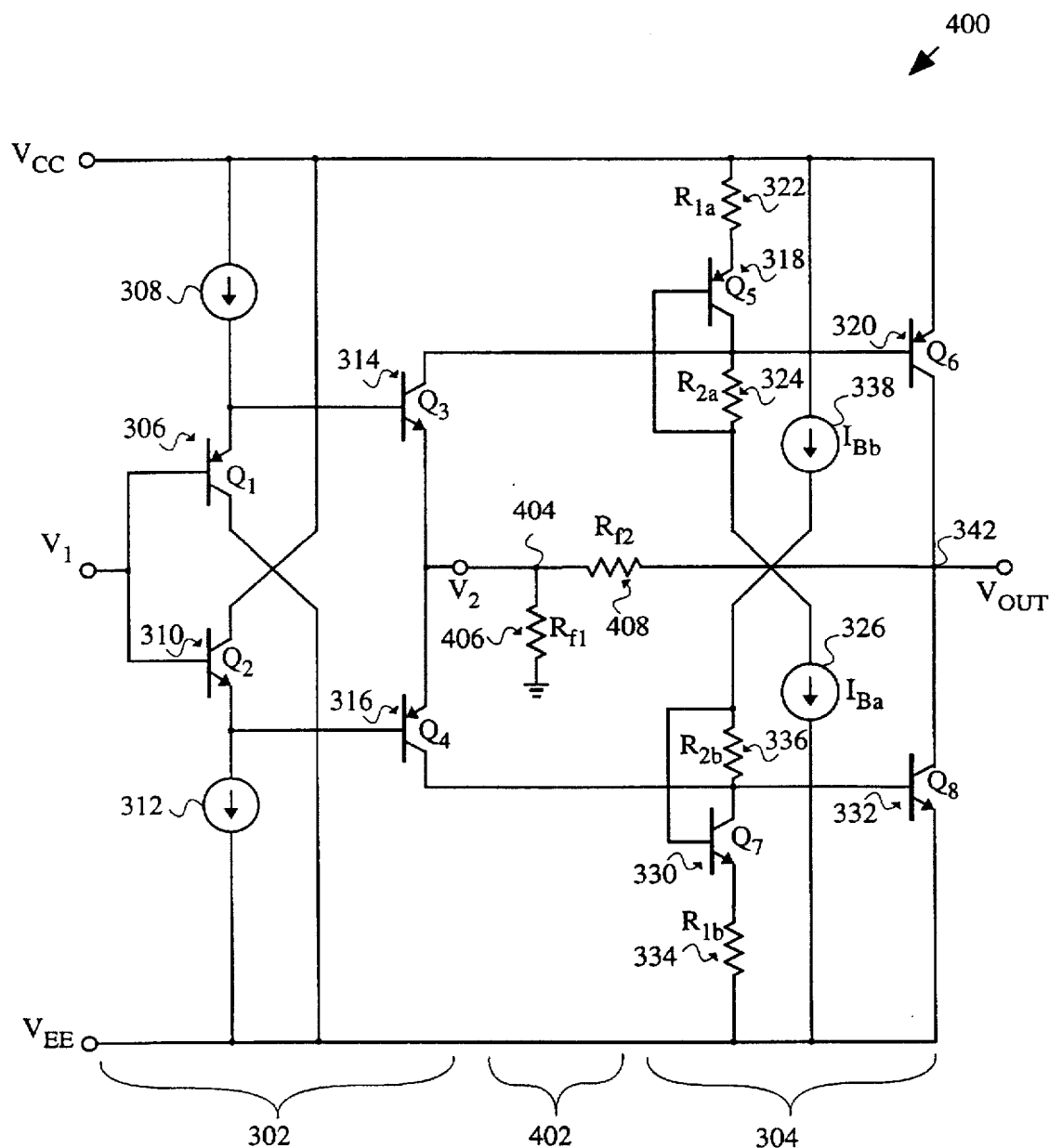
FIG. 4 illustrates a schematic diagram of an output stage according to a third embodiment of the invention.

FIG. 4 illustrates a schematic diagram of an output stage 400 according to a third embodiment of the invention. The output stage 400 is similar to the third embodiment illustrated in FIG. 3 in that the input diamond follower 302 and the current amplifier circuit 304 are provided. However, additionally, the output stage 400 further includes a feedback circuit 402. The feedback circuit 402 is coupled between the node 342 at the output terminal for the output voltage ($V_{OUT}$) and the second input voltage $V_2$ at a node 404. The feedback circuit 402 includes a voltage divider. The voltage divider includes a first feedback resistor ($R_{f1}$) 406 connected between the node 404 and ground (GND), and a second feedback resistor ($R_{f2}$) 408 connected between the node 404 and the node 342. The closed-loop gain is set by the values of the first and second feedback resistors 406 and 408 such that it is greater than unity.

The choice of values for the feedback resistors 406 and 408 will vary with the particular application of the output stage 400. Even still, the choosing of the values for the feedback resistors 406 and 408 involves a trade-off situation. The trade-off is that with smaller resister values, there is higher current (and thus power) utilization, whereas with larger resister values DC offset errors are problematic. More particularly, the feedback resistors 406 and 408 of the feedback circuit 402 draws a feedback current from the output terminal and power efficiency considerations preclude setting the feedback resistors 406 and 408 at small values. However, these feedback resistors 406 and 408 also act as emitter degeneration to transistors 314 and 316 ($Q_3$ and $Q_4$) and must supply current to those transistors 314 and 316 in order to the drive the current amplifier circuit 304. Hence, achieving high gain with these transistors 314 and 316 requires making the feedback resistors 406 and 408 ($R_{f1}$ and $R_{f2}$) resistances small.

Figure 5:
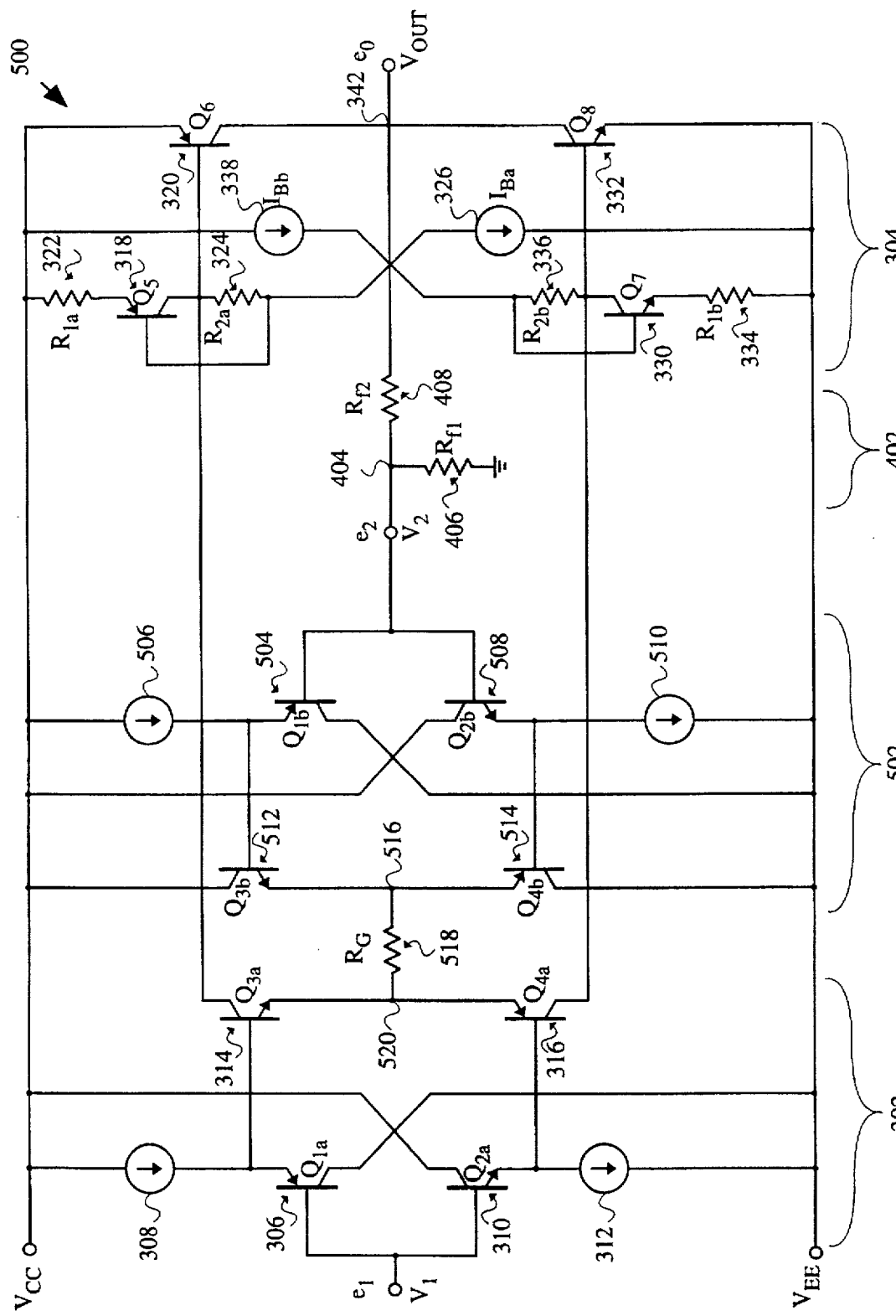
FIG. 5 illustrates a schematic diagram of an output stage according to a fourth embodiment of the invention.

For those cases where this trade-off cannot be resolved by an acceptable compromise for the resistance values, an additional buffer can be provided to permit independent control of the feedback current and the gain of the stage. FIG. 5 illustrates a schematic diagram of an output stage 500 according to a fourth embodiment of the invention. The fourth embodiment is substantially similar to the third embodiment illustrated in FIG. 4, except that additional buffering is provided. In the output stage 500, besides including the (first) input diamond follower 302, the output buffer 304 and the feedback circuit 402, the output stage 500 further includes a second input diamond follower 502.

The second input diamond follower 502 is connected between the first input diamond follower 502 and the feedback circuit 402. The second input diamond follower 502 includes a transistor ($Q_{1b}$) 504 and a transistor ($Q_{2b}$) 508. The base of the transistor 504 receives the input voltage $V_2$, the emitter of the transistor 504 is connected to a current source $I_c$ 506 that is in turn connected to the positive power supply source ($V_{CC}$), and the collector is coupled to the negative power supply source ($V_{EE}$). The base of the second transistor 508 receives the input voltage $V_2$, the collector of the transistor 508 is connected to the positive power supply source ($V_{CC}$), and the emitter of the transistor 508 is connected to a current source ($I_c$) 510 that is in turn connected to the negative power supply source ($V_{EE}$).

The second input diamond follower 502 also includes a transistor ($Q_{3b}$) 512 and a transistor ($Q_{4b}$) 514. The base of the third transistor 512 is connected to the emitter of the transistor 504, and the base of the transistor 514 is connected to the emitter of the transistor 508. The emitters of the transistor ($Q_{3b}$) 512 and the transistor ($Q_{4b}$) 514 are commonly connected together at a node 516. A resistor ($R_G$) 518 is also provided with the second input diamond follower 502. The resister ($R_G$) 518 is coupled to the first input diamond follower 302 at a node 520 that connects the emitters of the transistors 314 and 316. The first input diamond follower 302 still provides the two (complementary) outputs to the current amplifier circuit 304. Hence, in this embodiment, the feedback resistors ($R_{f1}$ and $R_{f2}$) 406 and 408 need only supply the base currents of the transistors 504 and 508 ($Q_{1b}$ and $Q_{2b}$) so large resistances can be used. Further, the resistor ($R_G$) 518 now serves as the emitter degeneration to the transistors of the input emitter follower 302. Here, the resistor ($R_G$) 518 only conducts that current needed to drive the current amplifier circuit 304 and therefore can have a small resistance value so that high gains are achievable.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An output stage for an amplifier circuit, comprising:

a first transistor having a base, an emitter and a collector, the emitter being connected to a first potential through a first resistor, the collector being connected to a second potential through a series connection of a second resistor and a bias current source, the base being connected at a node between the second resistor and the bias current source;

a second transistor having a base, an emitter and a collector, the emitter being connected to the first potential, the collector being connected to the second potential through a load element, the base being connected to the collector of said first transistor; and a signal current source for supplying a current signal to be amplified.

2. An output stage for an amplifier circuit, comprising:

a first transistor having a base, an emitter and a collector, the emitter being connected to a first potential through a first resistor, the collector being connected to a second potential through a series connection of a second resistor and a bias current source, the base being connected at a node between the second resistor and the bias current source;

a second transistor having a base, an emitter and a collector, the emitter being connected to the first potential, the collector being connected to the second potential through a load element, the base being connected to the collector of said first transistor; and a signal current source for supplying a current signal to be amplified, said current signal source being connected between the second potential and the common connection of the collector of said first transistor and the base of said second transistor.

3. An output stage for an amplifier circuit, comprising:

a first transistor having a base, an emitter and a collector, the emitter being connected to a first potential through a first resistor, the collector being connected to a second potential through a series connection of a second resistor and a bias current source, the base being connected at a node between the second resistor and the bias current source;

a second transistor having a base, an emitter and a collector, the emitter being connected to the first potential, the collector being connected to the second potential through a load element, the base being connected to the collector of said first transistor; and a signal current source for supplying a current signal to be amplified, the current signal provided by said signal current source includes a DC component for biasing and a AC component containing an input signal to be amplified and output.

4. An output stage as recited in claim 3, wherein said output stage provides an exponential gain to the input signal.

5. An output stage as recited in claim 4, wherein the input signal is an input current signal ($i_{s(AC)}$), and the input current signal is amplified and output as an output current signal ($i_c$) from the collector of said second transistor, and wherein the exponential gain is determined in accordance with the following equation:

$$i_c = I_s e^{i_{s(AC)} R_1 / V_T}$$

where $V_T$ is the thermal voltage, R1 is the resistance of the first resistor, and $I_s$ is the reverse saturation current for said second transistor.

6. An output stage as recited in claim 4, wherein the load element is a load resistor.

7. An output stage as recited in claim 6, wherein said first and second transistors are PNP-type transistors.

8. An output stage as recited in claim 6, wherein under quiescent conditions, the voltage drops across the first and second resistors are substantially equal.

9. An amplifier for amplifying a difference voltage between first and second input voltages to produce an output voltage, said amplifier comprising:

a first buffer circuit for receiving the first and second input voltages and producing complementary current signals; and a current amplification circuit for receiving the complementary current signals and outputting an output voltage, the output voltage being an amplified version of the difference of the first and second input voltages, said current amplification circuit including complementary circuitry, said complementary circuitry comprising:

a first circuit, connected to said first buffer circuit, including:

a first transistor having a base, an emitter and a collector, the emitter being connected to a first potential through a first resistor, the collector being connected to a second potential through a series connection of a second resistor and a first bias current source, the base being connected between the second resistor and the first bias current source, the collector also being connected to receive a first of the complementary current signals; and a second transistor having a base, an emitter and a collector, the emitter being connected to the first potential, the collector being connected to an output terminal from which the output voltage is obtained, the base being connected to the base of said first transistor;

a second circuit, connected to said first buffer circuit, said second circuit including:

a third transistor having a base, an emitter and a collector, the emitter being connected to the second potential through a third resistor, the collector being connected to the first potential through a series connection of a fourth resistor and a second bias current source, the base being connected between the fourth resistor and the second bias current source, the collector also being connected to receive a second of the complementary current signals; and a fourth transistor having a base, an emitter and a collector, the emitter being connected to the second potential, the collector being connected to the output terminal, the base being connected to the base of said third transistor.

10. An amplifier as recited in claim 9, wherein said first buffer circuit is an input diamond follower.

11. An amplifier as recited in claim 9, wherein said first buffer circuit comprises:

a fifth transistor having a base, an emitter and a collector, the emitter connected to the first potential through a first current source, the base being connected to receive the first input voltage, and the collector being connected to the second potential;

a sixth transistor having a base, an emitter and a collector, the emitter connected to the second potential through a second current source, the base being connected to receive the first input voltage, and the collector being connected to the first potential;

a seventh transistor having a base, an emitter and a collector, the emitter connected to the second input voltage, the base connected to the emitter of said fifth transistor, and the collector outputs the first of the complementary current signals; and an eighth transistor having a base, an emitter and a collector, the emitter connected to the second input voltage, the base connected to the emitter of said sixth transistor, and the collector outputs the second of the complementary current signals.

12. An amplifier as recited in claim 11, wherein said amplifier further comprises a feedback network coupled between the output terminal and the second input voltage.

13. An amplifier as recited in claim 12, wherein said feedback network comprises a voltage divider.

14. An amplifier as recited in claim 11, wherein said amplifier further comprises:

a feedback network coupled to the output terminal; and a second buffer circuit coupled between said feedback network and said first buffer circuit.

15. An amplifier as recited in claim 14, wherein said feedback network comprises a voltage divider.

16. An amplifier as recited in claim 14, wherein said second buffer circuit comprises:

a ninth transistor having a base, an emitter and a collector, the emitter connected to the first potential through a third current source, the base being connected to receive the second input voltage, and the collector being connected to the second potential;

a tenth transistor having a base, an emitter and a collector, the emitter connected to the second potential through a fourth current source, the base being connected to receive the second input voltage, and the collector being connected to the first potential;

a eleventh transistor having a base, an emitter and a collector, the emitter connected to the commonly connected emitters of said seventh and eighth transistors of said first buffer circuit through a gain resistor, and the base connected to the emitter of said ninth transistor; and an twelfth transistor having a base, an emitter and a collector, the emitter connected to the commonly connected emitters of said seventh and eighth transistors of said first buffer circuit through the gain resistor, and the base connected to the emitter of said tenth transistor.

17. An amplifier as recited in claim 9, wherein said amplifier further comprises a feedback network coupled between the output terminal and the second input voltage.

18. An amplifier as recited in claim 16, wherein said feedback network comprises a voltage divider.

* * * * *

UNITED STATES PATENT AND TRADEMARK OFFICE
CERTIFICATE OF CORRECTION

PATENT NO. : 5,736,902
DATED : April 7, 1998
INVENTOR(S) : Graeme

It is certified that error appears in the above-indentified patent and that said Letters Patent is hereby corrected as shown below:

Cover Page, after the Assignee, "Maxim Integrated Products, Inc., Sunnyvale, Calif." insert --Gain Technology Corp., Tucson, Ariz.--.

Signed and Sealed this

Twentieth Day of April, 1999

*Attest:*

Q. TODD DICKINSON

*Attesting Officer*      *Acting Commissioner of Patents and Trademarks*